United States Patent
Kido et al.

(10) Patent No.: US 7,195,826 B2
(45) Date of Patent: Mar. 27, 2007

(54) ORGANIC ELECTROLUMINESCENT DISPLAY DEVICE AND CHEMICAL COMPOUNDS FOR LIQUID CRYSTALS

(75) Inventors: Junji Kido, 6-6, Chuo-2-chome, Yonezawa-shi, Yamagata-ken 992-0045 (JP); Hitoshi Nakada, Yonezawa (JP); Teruo Tohma, Yonezawa (JP); Ryuji Murayama, Yonezawa (JP); Toshinao Yuki, Yonezawa (JP)

(73) Assignees: Tohoku Pioneer Corporation, Tendo (JP); Junji Kido, Yonezawa (JP)

( * ) Notice: Subject to any disclaimer, the term of this patent is extended or adjusted under 35 U.S.C. 154(b) by 327 days.

(21) Appl. No.: 10/650,361

(22) Filed: Aug. 28, 2003

(65) Prior Publication Data
US 2004/0043252 A1    Mar. 4, 2004

Related U.S. Application Data

(63) Continuation of application No. 09/844,151, filed on Apr. 27, 2001, now abandoned.

(30) Foreign Application Priority Data
Apr. 28, 2000   (JP)   .............................. 2000-128766

(51) Int. Cl.
H01L 51/54    (2006.01)
H01L 51/52    (2006.01)
G02F 1/13     (2006.01)

(52) U.S. Cl. ........................ 428/690; 428/1.3; 428/1.4; 428/917; 313/504; 313/506; 313/110; 313/111; 313/112; 257/98; 257/E51.044; 349/33

(58) Field of Classification Search .................... None
See application file for complete search history.

(56) References Cited

U.S. PATENT DOCUMENTS

| | | | |
|---|---|---|---|
| 5,748,271 A * | 5/1998 | Hikmet et al. ................. | 349/69 |
| 6,013,384 A | 1/2000 | Kido et al. ................. | 428/690 |
| 6,198,217 B1 | 3/2001 | Suzuki et al. ............... | 313/504 |
| 6,218,061 B1 * | 4/2001 | Hanna et al. ............ | 430/58.05 |
| 6,423,429 B2 | 7/2002 | Kido et al. ................. | 428/690 |
| 6,858,271 B1 * | 2/2005 | Okada et al. ................. | 428/1.4 |
| 6,897,913 B2 * | 5/2005 | Tsuboyama et al. .......... | 349/61 |

FOREIGN PATENT DOCUMENTS

| | | |
|---|---|---|
| JP | 59-181422 | 12/1984 |
| WO | WO 00/36660 A1 * | 6/2000 |

OTHER PUBLICATIONS

"Advanced Inorganic Chemistry, A Comprehensive Text", 2nd. ed., F. Albert Cotton and Geoffrey Wilkinson, copyright 1966 by John Wiley & Sons, Inc., pp. 1009-1010.*

* cited by examiner

Primary Examiner—Marie Yamnitzky
(74) Attorney, Agent, or Firm—The Webb Law Firm

(57) ABSTRACT

The new organic electroluminescent display device has a carrier-transporting layer and/or an organic luminous layer composed of a nematic liquid crystal or a liquid crystal dispersing a carrier-transporting low-molecule therein. When the organic luminous layer is to be bestowed with faculty as a liquid crystal, it is made of a nematic liquid crystal. Both the carrier-transporting layer and the organic luminous layer may be bestowed with faculty as a liquid crystal. Since the liquid crystal is incorporated in the carrier-transporting layer and/or the organic luminous layer, the display device can be driven as a liquid crystal display device in a dark place by charging with a voltage lower than a light emission initiating potential. Of course, it is driven as an electroluminescent display device when it is charged with a voltage higher than the light emission initiating potential. Use of an electroluminescent liquid crystal as a organic luminous layer enables omission of a carrier-transporting layer.

17 Claims, 3 Drawing Sheets

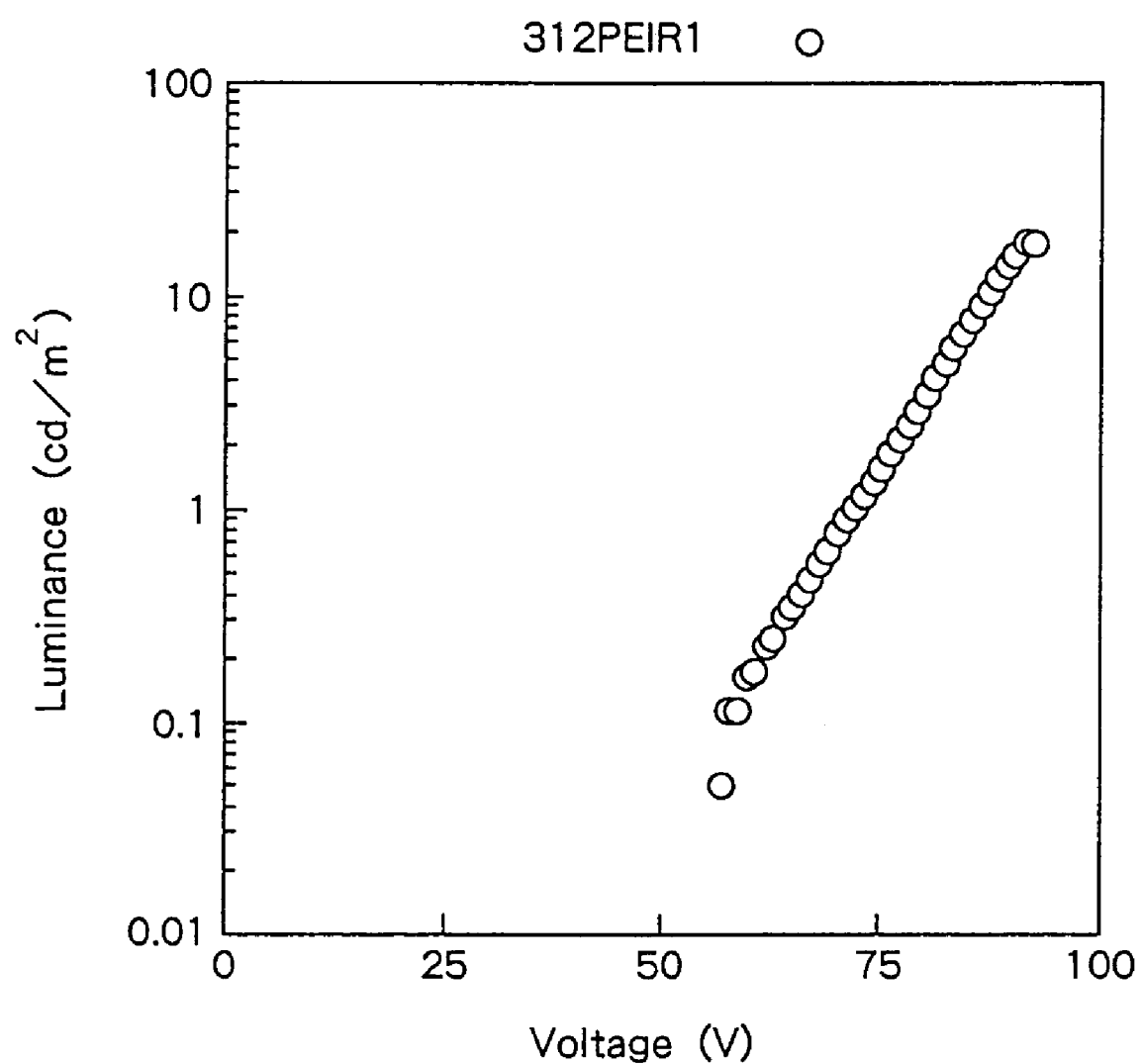

ORGANIC ELECTROLUMINESCENT DISPLAY DEVICE AND CHEMICAL COMPOUNDS FOR LIQUID CRYSTALS

CROSS-REFERENCE TO RELATED APPLICATIONS

This application is a continuation of U.S. patent application Ser. No. 09/844,151 filed Apr. 27, 2001, now abandoned, which claimed the benefit of Japanese Patent Application No. 2000-128766 filed Apr. 28, 2000.

BACKGROUND OF THE INVENTION

Field of the Invention

The present invention relates to an organic electroluminescent display device which is also driven as a liquid crystal display device, and also to electroluminescent chemical compounds useful as liquid crystals.

DETAILED DESCRIPTION OF THE INVENTION

A conventional electroluminescent display device has the structure that a transparent electrode (an anode), a carrier-transporting layer, an organic luminous layer and a backside electrode (a cathode) are successively laid on a transparent substrate. A plurality of transparent electrodes are aligned along X-X direction, while a plurality of backside electrodes are aligned along Y-Y direction, so as to make up XY matrix.

When a driving current is supplied to a predetermined position on XY matrix through the transparent and backside electrodes, a hole from the anode recombines with an electron from the cathode in the organic luminous layer. An organic luminous molecule, which is excited by the recombination, emits light. The light is emitted through the transparent electrode and the transparent substrate to the outside.

Since the organic electroluminescent display device has the feature that the organic luminous layer itself emits light, a clear image is reproduced as compared to the liquid crystal display device. However, power consumption for driving the organic electroluminescent display device is unfavorably greater than that for the liquid crystal display device using reflection of outside light.

The liquid crystal display device reproduces a clear image with high contrast under a light condition, but an image is hardly distinguishable at night or in a dark place. Shortage of luminance is supplemented by backlight in order to solve difficulty to distinguish an image. Use of backlight means increase of power consumption.

Such difficulty to distinguish an image is overcome by lamination of an electroluminescent element on a liquid crystal display device, as disclosed in Utility Model Publication No. 59-181422. The proposed liquid crystal display device reproduces an image distinguishable in dark place, due to planar emission of the electroluminescent element. The liquid crystal display device is also made thinner than a known liquid crystal display device having an electroluminescent element provided at the back side, since the electroluminescent element is directly laid on the liquid crystal display device.

The liquid crystal display device disclosed in Utility Model Publication No. 59-181422 is fabricated by positioning a liquid crystal element composed of a transparent electrode, an oriented film, a polarizing plate, a spacer and a liquid crystal layer between a couple of glass substrates, and then forming an electroluminescent element on one of the glass substrates. Since the electroluminescent element is merely laid on the liquid crystal element, such the liquid crystal display device is necessarily manufactured by a complicated process with increased number of lamination. The increased number of lamination makes it difficult to reduce a thickness of the display device.

SUMMARY OF THE INVENTION

The present invention aims at provision of a new electroluminescent element, which reproduces a distinct image with reduced power consumption, and also provision of electroluminescent chemical compounds useful as liquid crystals. An object of the present invention is to bestow a carrier-transporting layer and/or an organic luminous layer with faculty as a liquid crystal, so that the new display device acts as an electroluminescent display device at night or in a dark place without lighting and also as a liquid crystal display device at a daytime or in a lighting place.

The newly proposed organic electroluminescent display device has one or both of a carrier-transporting layer and an organic luminous layer bestowed with faculty of a liquid crystal, so as to be driven as a liquid crystal display device or as an electroluminescent display device in response to magnitude of a drive voltage. The display device may be driven by either a simple matrix method or an active matrix method.

For instance, it is driven as a liquid crystal display device, which reproduces an image with variable contrast, at a voltage lower than a light emission initiating potential, and as an electroluminescent display device at a voltage higher than a light emission initiating potential, due to the feature of a conventional organic electroluminescent element which need a higher drive voltage. Such change of display mechanism saves power consumption.

Of course, it is predicted that the organic electroluminescent element can be driven at a voltage lower than that for a liquid crystal with progress of technology on an organic electroluminescent element. In such a case, display mechanism will be switched between the electroluminescent display device and the liquid crystal display device, accounting distinctness of an image.

The new organic electroluminescent display device having a carrier-transporting layer bestowed with faculty as a liquid crystal is of the structure that at least one carrier-transporting layer composed of a liquid crystal and at least one organic luminous layer are sandwiched between a transparent electrode and a backside electrode each held in parallel to the other. The organic luminous layer is made of a polymer, a low molecule-dispersed polymer or a bilayer of a polymer and a monomer. The carrier-transporting layer disperses a nematic liquid crystal or a low-molecular carrier-transporting substance therein.

The new organic electroluminescent element having an organic luminous layer bestowed with faculty as a liquid crystal is of the structure that at least one carrier-transporting layer and at least one organic luminous layer composed of a liquid crystal are sandwiched between a transparent electrode and a backside electrode each held in parallel to the other. In this case, the carrier-transporting layer is made of a polymer, a low molecule-dispersed polymer or a bilayer of a polymer and a monomer. The organic luminous layer contains a nematic liquid crystal therein.

The new organic electroluminescent element having both of a carrier-transporting layer and an organic luminous layer bestowed with faculty as liquid crystals is of the structure that the carrier-transporting layer and the organic luminous layer, both of which contain liquid crystals therein, are sandwiched between a transparent electrode and a backside electrode.

Two or more of different organic compounds may be included in a liquid crystal layer, by blending a liquid crystal with an organic luminous substance for instance.

In case of using an electroluminescent liquid crystal compound as an organic luminous layer, an electroluminescent display device may be fabricated without deposition of a carrier-transporting layer. The wording "electroluminescent" of such a liquid crystal means ability of carrier-transportation (including carrier-injection) and light emission as a faculty of an electroluminescent device in this specification.

The newly proposed organic electroluminescent substance, which also perform liquid crystal faculty, are chemical compounds I–V having general structures under-mentioned. 12-OKB, 8-OKB and 16-OKB belong to the chemical compound I, 18-OXD belongs to the chemical compound II, 8-OCu belongs to the chemical compound III, 8-PNP-O12 belongs to the chemical compound IV, and TPD-8 belongs to the chemical compound V.

Chemical Compound I:

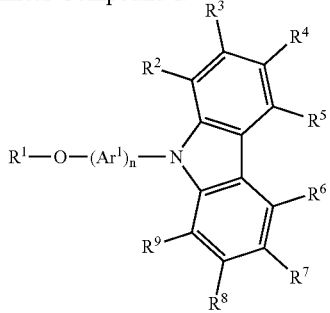

wherein $R^1$ is a straight-chained alkyl group containing 1–20 carbon atoms, $R^2$ to $R^9$ is individually hydrogen or an alkyl group containing 1–3 carbon atoms, and $Ar^1$ is a substituted or non-substituted aryl group containing 6–14 carbon atoms.

Chemical Compound II:

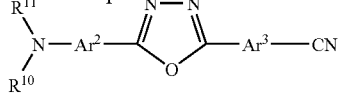

wherein $R^{10}$ and $R^{11}$ are individually straight-chained alkyl groups containing 1–20 carbon atoms, and $Ar^2$ and $Ar^3$ are individually substituted or non-substituted aryl groups containing 6–14 carbon atoms.

Chemical Compound III:

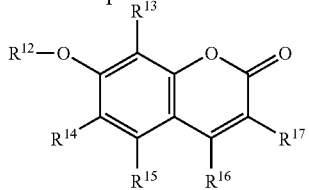

wherein $R^{12}$ is a straight-chained alkyl group containing 1–20 carbon atoms, and $R^{13}$ to $R^{17}$ are individually hydrogen or alkyl groups containing 1–3 carbon atoms.

Chemical Compound IV:

wherein $R^{18}$ and $R^{19}$ are individually straight-chained alkyl groups containing 1–20 carbon atoms, and $Ar^4$ and $Ar^5$ are individually substituted or non-substituted aryl groups containing 6–14 carbon atoms.

Chemical Compound V:

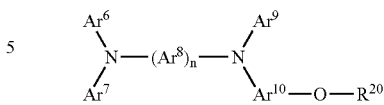

wherein $R^{20}$ is a straight-chained alkyl group containing 1–20 carbon atoms, and $Ar^6$ to $Ar^{10}$ are individually substituted or non-substituted aryl groups containing 6–14 carbon atoms.

BRIEF DESCRIPTION OF THE DRAWINGS

FIG. 6 a graph illustrating relationship of light emission with a voltage applied to an organic electroluminescent device fabricated in Example 8.

DETAILED DESCRIPTION OF THE PREFERRED EMBODIMENTS

Figure 1:
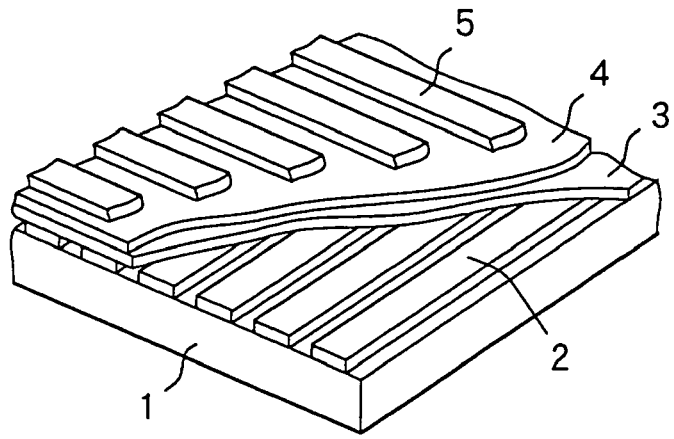
FIG. 1 is a bird eye's view illustrating an organic electroluminescent element partially cut off.
Figure 2:
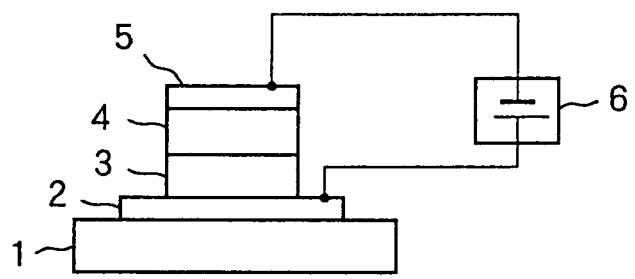
FIG. 2 is a view for explaining driving mechanism of an organic electroluminescent display device.

The newly proposed electroluminescent display device is of structure as shown in FIG. 1. A transparent electrode 2 (an anode) is laid on a transparent substrate 1 such as glass or synthetic resin film, by vapor deposition of ITO or the like. After a carrier-transporting layer 3, an organic luminous layer 4 and a backside electrode 5 (a cathode) are successively laid thereon, the whole body is hermetically sealed with a protective layer such as a glass or metal sheet.

The transparent electrode 2 is formed in a striped shape extending along X-X direction, while the backside electrode 5 is formed in a striped shape extending along Y-Y direction crossing X-X direction with a right angle. The trilayer structure that an electron-transporting layer and a hole-transporting layer are placed at both sides of the organic luminous layer 4 may be also adopted.

A gap between the transparent electrode 2 and the backside electrode 5 is charged with a voltage by a driving circuit 5. When application of the voltage is controlled by signals representing an image, the organic luminous layer 4 is excited at a predetermined position on X-Y matrix. Light is emitted by excitation of the luminous layer 4 to reproduce the image. A positive direct current is ordinarily used for the charging, but a reverse voltage may be superimposed to inhibit degradation of the organic luminous layer 4.

One or more of under-mentioned polymers and copolymers are solely or combinatively used for substance of the organic luminous layer 4. A polymer-type organic luminous layer may be formed by application of a liquid to form a coating layer. Hereinafter, the word "polymers" used in the specification of the present invention involves copolymers.

A Group of Polyparaphenylene Vinylene
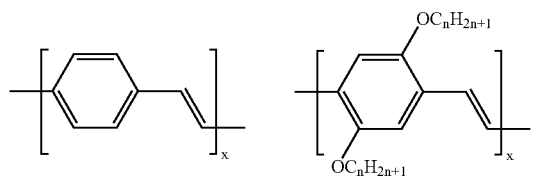
PPV  RO-PPV
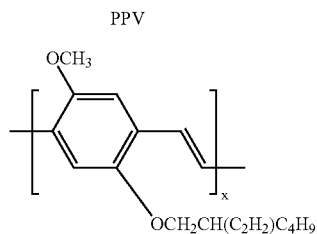
MEH-PPV
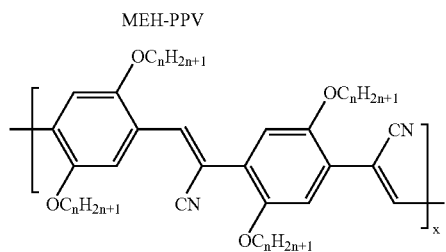
CN-PPV
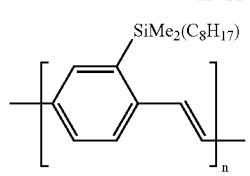
DMOS-PPV
A Group of Polyparaphenylene
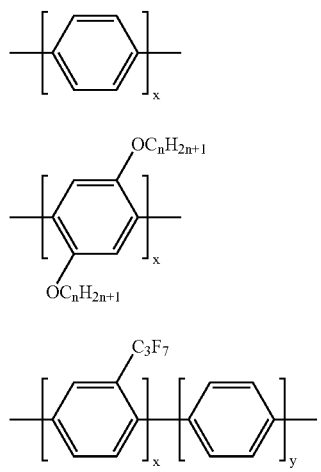
PPP
RO-PPP
FP-PPP
-continued
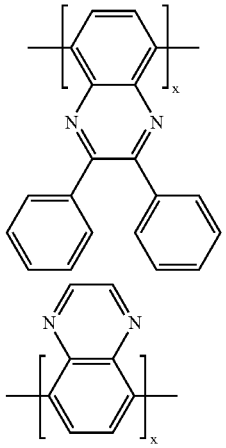
PdPhQx
PQx
A Group of Polyvinylcarbazole
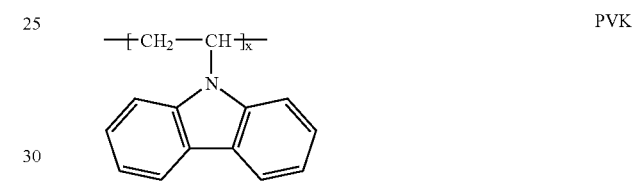
PVK
A Group of Polythiophene
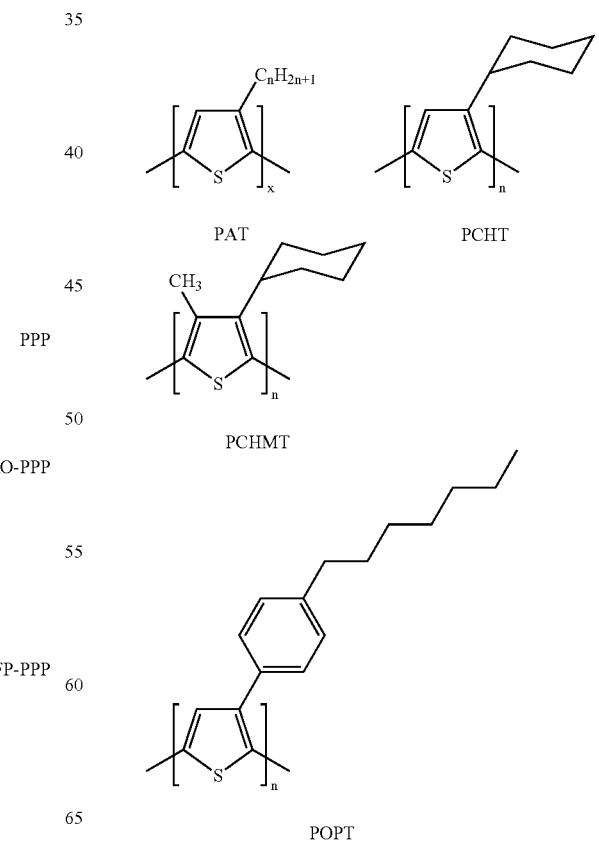
PAT  PCHT
PCHMT
POPT -continued

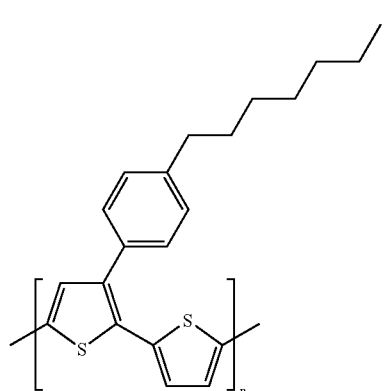

PTOPT

A Group of Polysilane

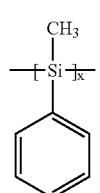

PMPS

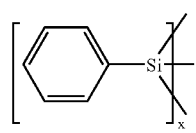

PPS

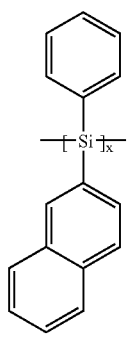

PNPS

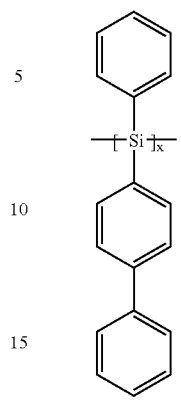

PBPS

A Group of Poly Alkylfluorene

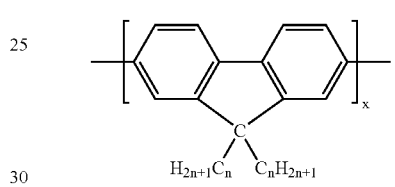

PDAF

Copolymers

P(VK-co-OXD) (a random copolymer of 9-vinylcarbazole with oxadiazole vinyl monomer), PTDOXD (an alternate arrangement polymer of tetraphenyl diamine with oxadiazole)

A low molecule-dispersed polymer, which comprises a polymer dispersing a low molecule as a dopant, is also useful for formation of the organic luminous layer. A dopant for the purpose may be organic substances having constitutional formulas as follows.

perylene

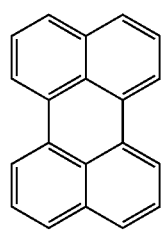

cumarin-6

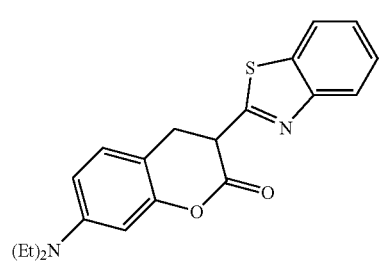

Qd-1

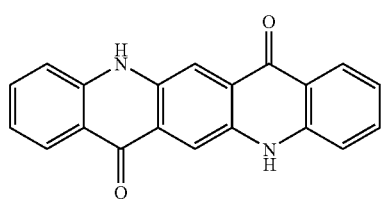

Qd-3

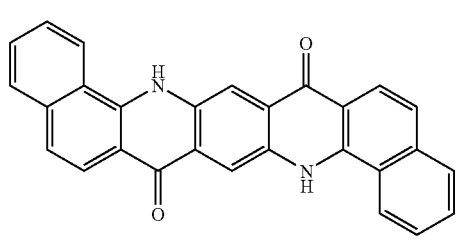

-continued
Qd-2
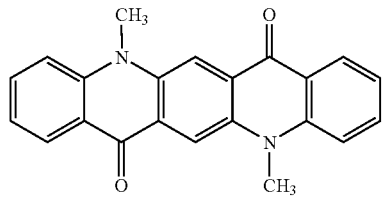
BCzVBi
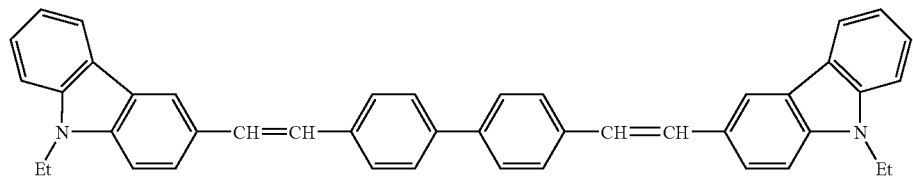
DCM1
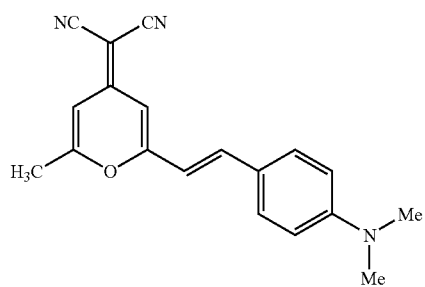
DCM2
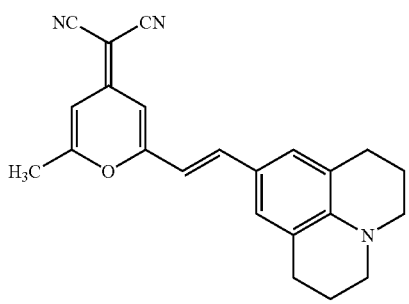
rubrene
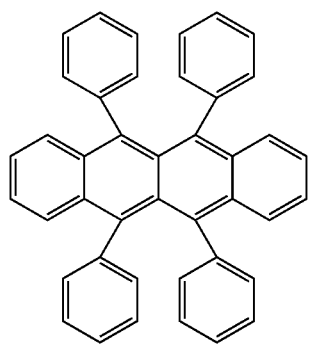
TPP
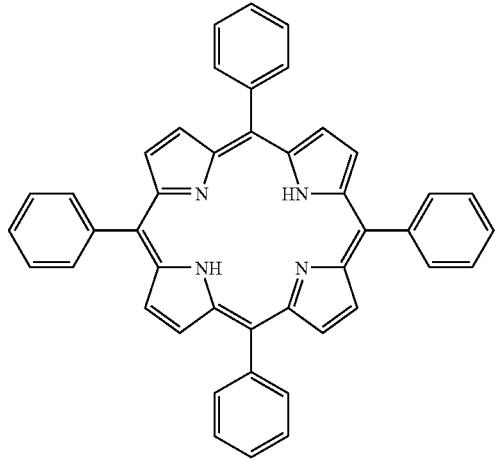
Alq$_3$
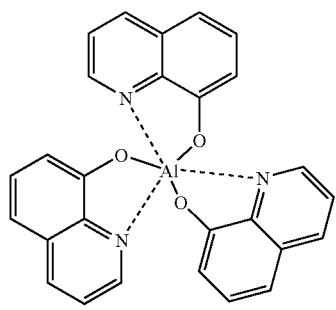
Znq$_2$
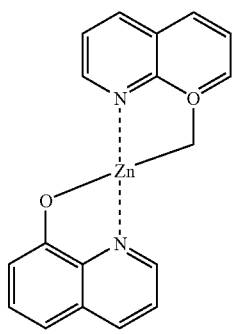

-continued
Zn(BOX)₁
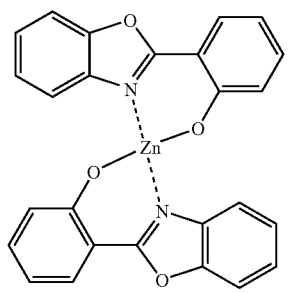
Zn(BTZ)₂
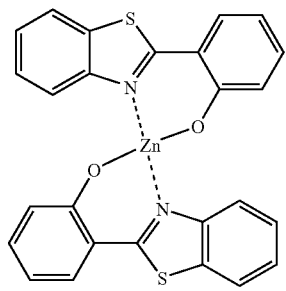
BeBq₂
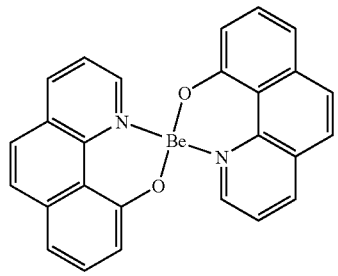
Be(5Fla)₁
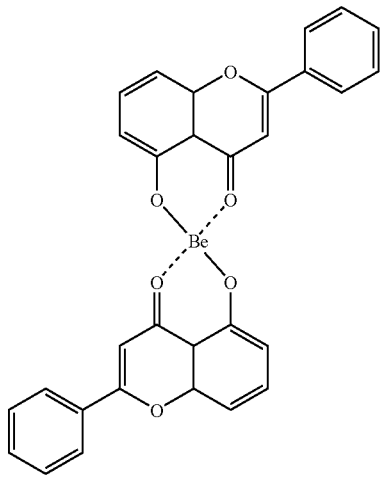
BAlq₂
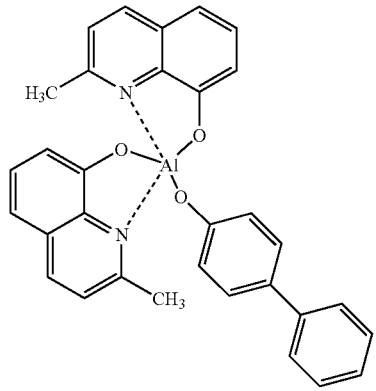
Almq₃
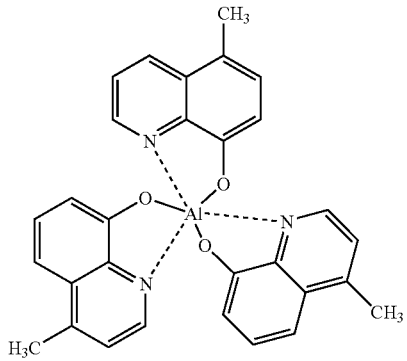
Alph₃
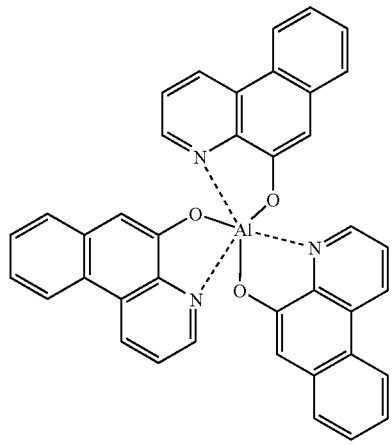

-continued
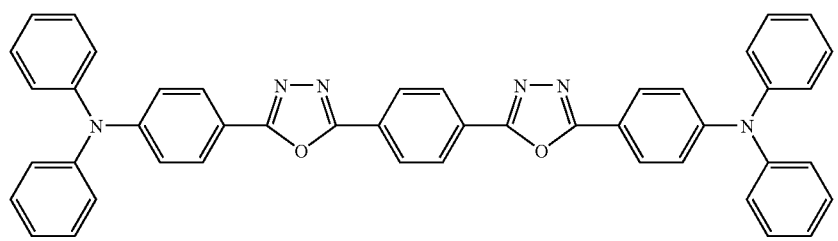
EM₂
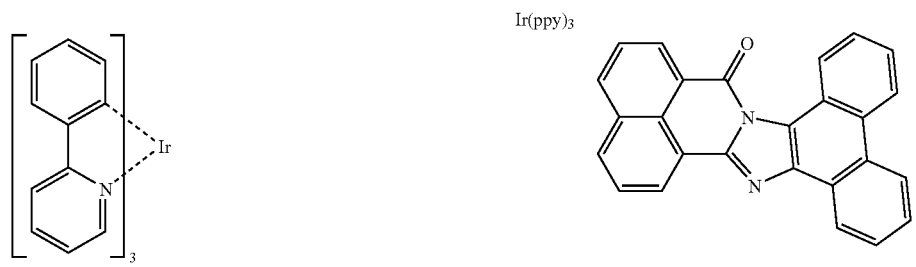
Ir(ppy)₃      P1
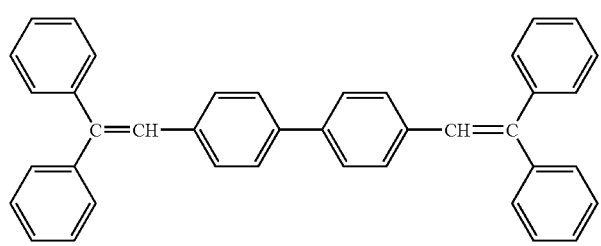
DPVBi
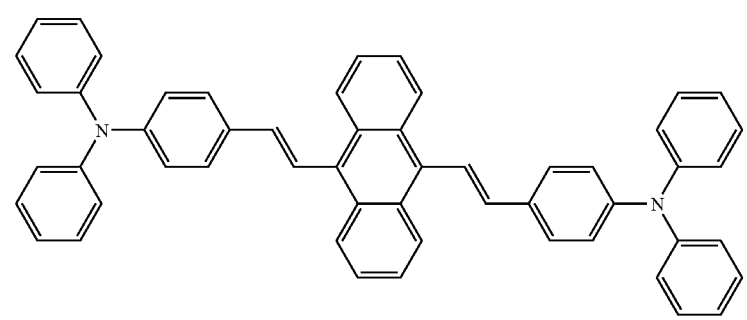
DSA
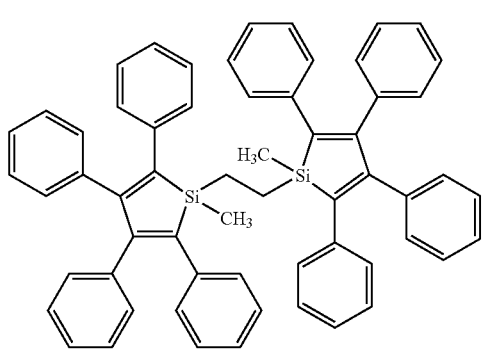
2PSP
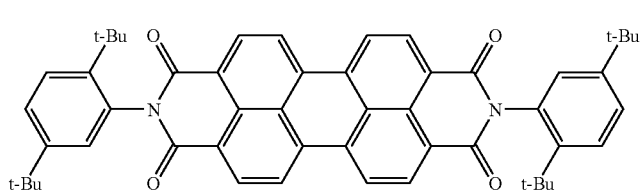
tBu-PTC

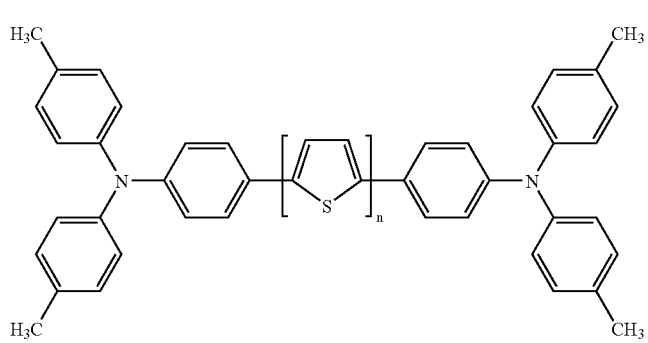

BMA-nT

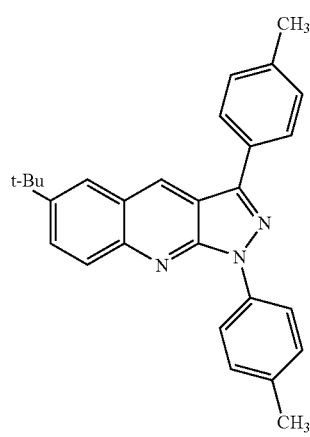

PZ10

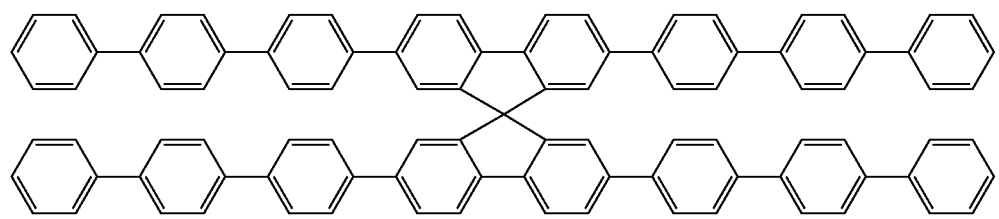

spiro-8Φ

Use of a low molecule-dispersed polymer enables adjustment of a luminous color in correspondence with a kind and concentration of a dopant. For instance, a luminous color such as blue, green or orange is realized by doping PVK (polyvinylcarbazole) with fluorochrome such as TPB (1,1,4,4,-tetraphenyl-1,3-butadiene), cumarin, DCM-1 or rubrene. In the case where such a low molecule-dispersed polymer is used for an organic luminous layer, a luminous color from a part can be advantageously differentiated from the other part by pre-doping the polymer with multiple pigments so as to diminish fluorescent of a specified pigment(s) by irradiation with light of specified wavelength. A luminous plane may be properly patterned by partial irradiation using a photomask.

The organic luminous layer may be of bilayer structure. For instance, when 1,2,4-triazoles/aluminum complex is deposited as a hole blocking layer on a luminous layer composed of poly(N-vinylcarbazole) capable of hole transportation, the luminous layer emits blue light. A luminous color is freely changed by selection of fluorochrome for doping poly(N-vinylcarbazole).

Faculty as a liquid crystal display device is realized by laying a liquid crystal layer containing a nematic liquid crystal on a carrier-transporting layer or an organic luminous layer which has been used so far as organic electroluminescent substances, or by mixing such the liquid crystal in the carrier-transporting layer or the organic luminous layer. A carrier-transporting layer or an organic luminous layer may be also made of a substance which acts as both a liquid crystal and an electroluminescence. Such the substance may be a nematic liquid crystal prepared by the following process, for instance.

[Synthesis of a Carrier-Transporting Liquid Crystal 8-OkB (2-1,4-carbazole-4'-n-octyloxybiphenyl)]

After 4-bromo-4'-hydroxybiphenyl is dissolved in cyclohexanone, potassium carbonate and 1-iodine octane are added to the liquid and subjected to reflux reaction in a nitrogen atmosphere. When the reaction is completed, a reaction product is dissolved in diethyl ether and then filtered. A recovered filtrate is separated from the solvent, refined with ethanol, and then recrystallized. A white solid (8-OB) is produced according to the formula of:

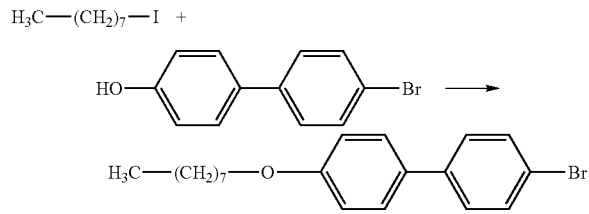

8-OB is blended with carbazole, palladium acetate, phosphine, sodium tertiary butyrate and o-xylene, and subjected to reflux reaction in a nitrogen atmosphere. At the end of the reaction, a reaction product is extracted in chloroform, washed with distilled water, refined by a column chromatography using chloroform and n-hexane at a ratio of 1:2, and then recrystallized to produce a white solid (8-OKB) according to the formula of:

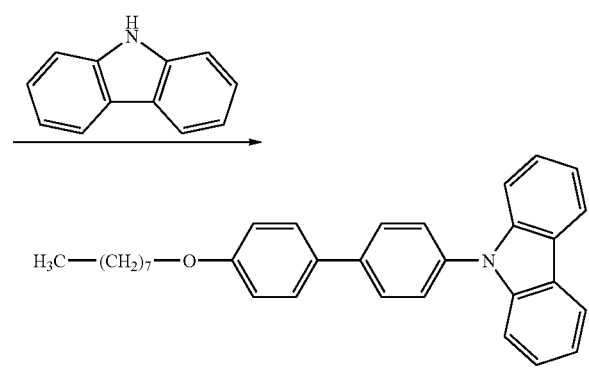

[Synthesis of a Carrier-Transporting Liquid Crystal 12-OKB (2-2,4-carbazole-4'-n-dodecaxybiphenyl)]

After 4-bromo-4'-hydroxybiphenyl is dissolved in cyclohexanone, potassium carbonate and 1-iodine decane are added to the liquid and subjected to reflux reaction in a nitrogen atmosphere. At the end of the reaction, a reaction product is dissolved in diethyl ether and filtered. A recovered filtrate is separated from a solvent, refined with ethanol and then recrystallized to produce a white solid (12-OB) according to the formula of:

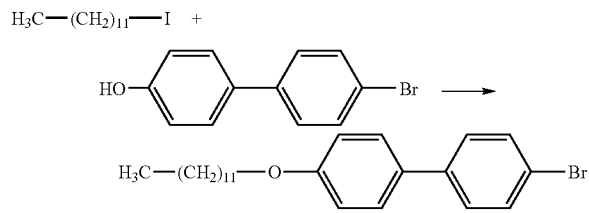

12-OB is blended with carbazole, palladium acetate, phosphine, sodium tertiary butyrate and o-xylene, and subjected to reflux reaction in a nitrogen atmosphere. At the end of the reaction, a reaction product is extracted in chloroform, washed with distilled water, refined by a column chromatography using chloroform and N-hexane at a ratio of 1:2, and recrystallized to produce a white solid (12-OKB) according to the formula of:

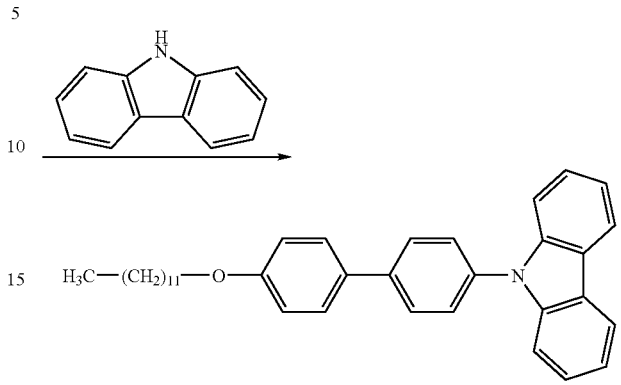

[Synthesis of 18-OXD (2-1,2-(4-n-methyl Octadecyl Aminophenyl)-5-(4-cyanophenyl)-1,3,4-oxadiazole)]

After N-methyl octadecylamine (Na) is dissolved in cyclohexanone, potassium carbonate and 4-bromo benzonitrile are added to the liquid and subjected to reflux reaction in a nitrogen atmosphere. At the end of the reaction, a reaction product is dissolved in chloroform and filtered. A recovered filtrate is separated from the solvent, and unreacted matters are sublimated. In this case, a yellow solid (Nab) is obtained according to the formula of:

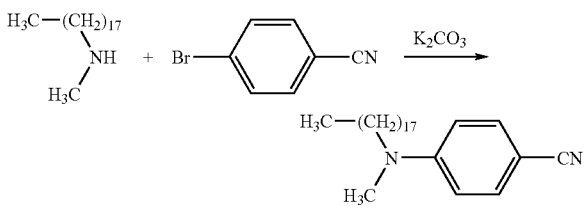

The yellow solid (Nab) is blended with an excessive amount of sodium azide and ammonium chloride, subjected to reflux reaction with heat in dimethylformamide, and washed with distilled water and chloroform, to produce a brown viscous matter (4NabN) according to the formula of:

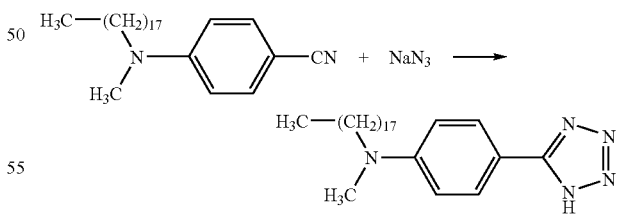

The product (4NabN) is dissolved in pyridine, subjected to reflux reaction with heat in a nitrogen atmosphere. The reaction is continued under the condition that 4-cyanobenzoyl chloride dissolved in pyridine is being dropped. After completion of the reaction, a reaction product is separated from pyridine, and washed with distilled water and chloroform, to produce a brown viscous matter. The brown viscous matter is refined to a brown solid by a column chromatography using ethyl acetate and n-hexane at a ratio of 3:2 and then recrystallized to a yellowish white solid (18-OXD) with methanol. The reaction to 18-OXD is:

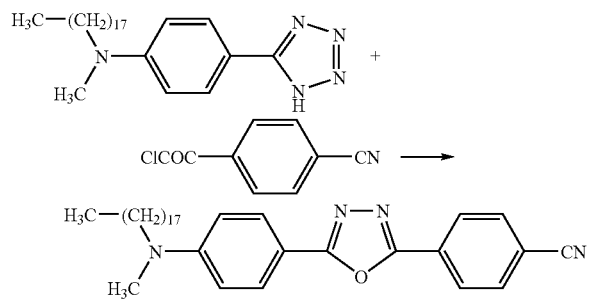

[Synthesis of 8-OCu (2-2,4-cumarin-4'-n-octyl)]

After 4-cumarin is dissolved in cyclohexanone, potassium carbonate and 1-iodine octane are added to the liquid, and subjected to reflux reaction in a nitrogen atmosphere. At the end of the reaction, a reaction product is dissolved in tetrahydrofuran and filtered. A recovered filtrate is separated from the solvent, and recrystallized with n-hexane, to produce a white solid (8-OCu) according to the formula of:

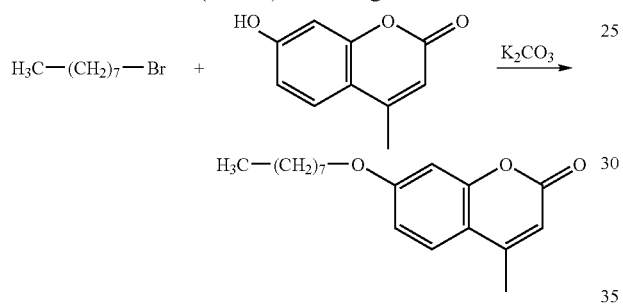

[Synthesis of 16-OKB (2,3,4-carbazole-4'-n-dodecahexyl Biphenyl)]

After 4-bromo-4'-hydroxybiphenyl is dissolved in cyclohexanone, potassium carbonate and 1-bromo dodecaxyl are added to the liquid, and subjected to reflux reaction in a nitrogen atmosphere. At the end of the reaction, a reaction product is dissolved in diethyl ether and filtered. A recovered filtrate is separated from the solvent, refined with ethanol and recrystallized, to produce a white solid (16-OB) according to the formula of:

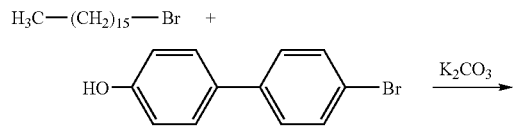

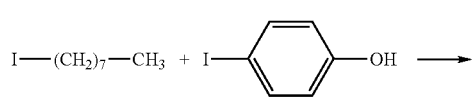

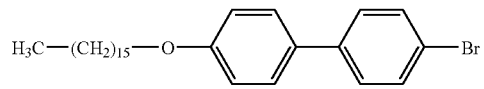

The product 16-OB is blended with carbazole, palladium acetate, phosphine, sodium tertiary butyrate and o-xylene, and subjected to reflux reaction in a nitrogen atmosphere. At the end of the reaction, a reaction product is extracted in chloroform, washed with distilled water, refined by a column chromatography using chloroform and n-hexanone at a ratio of 1:2, and then recrystallized in ethanol, to produce a white solid (16-OKB) according to the formula of:

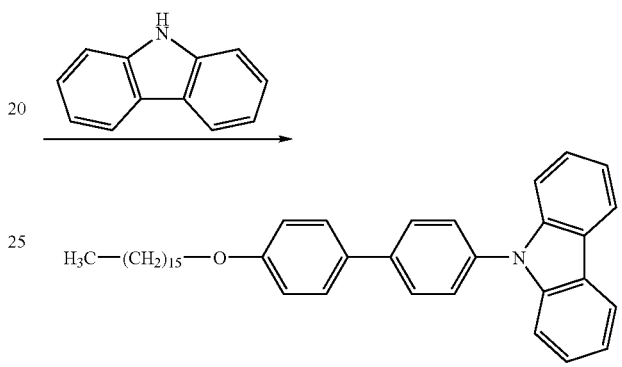

[Synthesis of a Carrier-Transporting Liquid Crystal TPD-8 (N,N'-diphenyl-N,N'-(4-octyloxyphenyl)-1,1'-biphenyl-4,4'-diamine)]

At first, p-iodophenol is dissolved in cyclohexane, potassium carbonate, and 1-iodine octane are added to the cyclohexane, and then the liquid is subjected to reflux reaction in a nitrogen atmosphere. At the end of the reaction, a brown liquid is obtained by filtration. The brown liquid is refined to a light yellow liquid by column chromatography using n-hexane as an eluent. OIB (octyl iodobenzene) is produced by drying the refined yellow liquid under vacuum.

OIB is mixed with N,N'-diphenyl benzine, palladium acetate, tri-tert-butylphosphine, sodium tertiary butyrate and o-xylene, and the mixture is subjected to reflux reaction in a nitrogen atmosphere. At the end of the reaction, a reaction product is extracted in chloroform and washed with water. The reaction product is refined to a colorless transparent viscous matter by column chromatography using chloroform and n-hexane at a ratio of 1:1. Thereafter, the product is freeze-dried and recrystallized to a white solid (TPD-8) in 2-propanol.

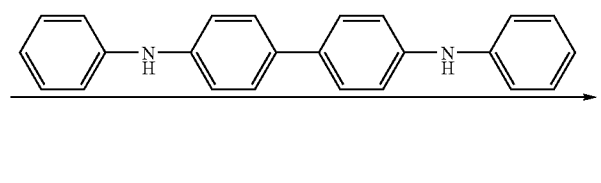

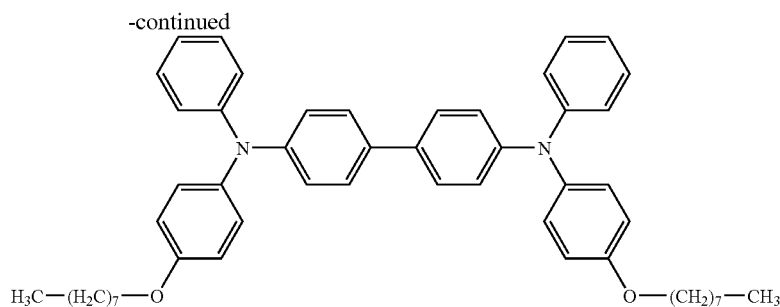

TPD-8

[Synthesis of a Bipolar Carrier-Transporting Liquid Crystal 8-PNP-O12 (2-4,2-(4'-octylphenyl)-6-dodecyloxy Naphthalene)]

After 6-bromo-2-naphthol is dissolved in cyclohexanone, potassium carbonate and 1-bromo dodecane are added to the liquid, and subjected to reflux reaction in a nitrogen atmosphere. At the end of the reaction, a reaction product is dissolved in diethanol, and filtered. A recovered filtrate is separated from the solvent, refined with methanol, and then recrystallized, to produce a white solid (12NaB) according to the formula of:

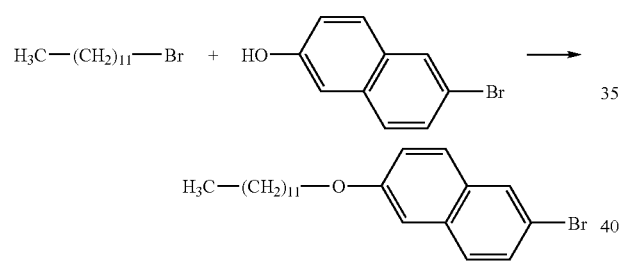

4-bromo-n-octyl benzene is dissolved in tetrahydrofuran, cooled in a nitrogen atmosphere to a sub-zero temperature, and reacted with n-butyllithium at 0° C. The reaction product is re-cooled at a sub-zero temperature, and then reacted with 2-isopropoxy-4,4,5,5-tetramethyl-1,3,2-dioxy borane at a room temperature. Distilled water is added to the reaction product at the end of the reaction, and then the reaction product is washed with chloroform and salty water, and refined by a column chromatography using chloroform and n-hexanone at a ratio of 1:2, to produce a colorless transparent liquid (8BB) according to the formula of:

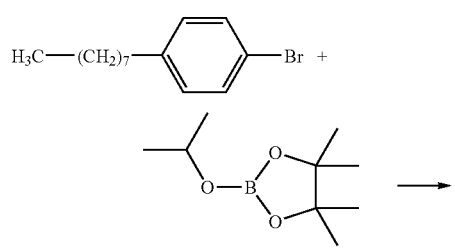

Both 12NaB and 8BB are dissolved in tetrahydrofuran, and reacted with a potassium carbonate aqueous solution and Pd(PPh$_3$)$_4$ at a warm temperature. After distilled water is added to the reaction product at the end of the reaction, the reaction product is washed with chloroform and salty water, and then refined by a column chromatography using chloroform and n-hexanone at a ratio of 1:2, to produce a white solid (8-PNP-O12) according to the formula of:

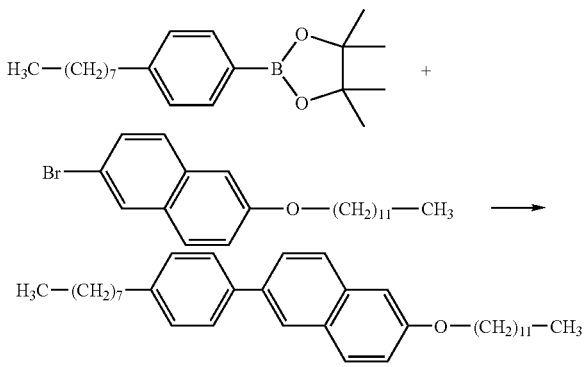

EXAMPLE 1

After an ITO film was laid on a glass substrate (a transparent substrate 1), the substrate was washed. A positive resist material applied onto the substrate by a spin coater and then annealed at 100° C. for 50 minutes, to form a resist film. The resist film was irradiated 10 seconds with a ultraviolet ray, using a photomask having a predetermined pattern. The irradiated resist film was developed by washing with ion-exchanged water to flush solubilized resist material. Thereafter, the glass substrate was chemically etched, and the remaining resist film was dissolved off the substrate, so as to shape the ITO film (a transparent electrode 2) to a striped pattern.

After the ITO layer is patterned, an organic luminous substance MEH-PPV [poly(2-methoxy-5-ethyl hexoxy)-1,4- phenylenevinylene] was deposited on the substrate to thickness of 100 nm and then rubbed. A thin Al film was vapor deposited as a patterned backside electrode 5 on another glass substrate, and then MEH-PPV was deposited to thickness of 100 nm and rubbed. These glass substrates were piled up and bonded together with epoxy resin except for a liquid crystal injecting hole. A cell gap between the substrates was adjusted to 900 nm.

A liquid crystal prepared by dispersing 12-OKB in 5CB at a ratio of 10 wt. % was used as an organic luminous substance. 12-OKB was a nematic liquid crystal, which was transferred to a liquid crystal phase near a room temperature in a state incorporated in 5CB. Schlieren texture was observed at ratios of 5 wt. %, 10 wt. % and 20 wt. %.

MEH-PPV as an electron-transporting luminescent compound was synthesized through 2-2-1,1-(2'-ethyl-hexyloxy)-4-methoxybenzene (EHMB) and then 2-2-2,1,4-bis(chloromethyl)-2-(2'-ethyl-hexyloxy)-5-methoxybenzene (BCMB) as follows:

At first, 3-bromomethyl heptane dissolved in ethanol was dropped in an ethanol liquid dissolving methoxyphenol and potassium hydroxide therein in a nitrogen gas stream. After 3-bromomethyl heptane was completely dropped, the liquid was refluxed 24 hours at 80° C. in an oiling bath. After the reaction, the liquid was filtered, the filtrate was recovered, and the solvent was removed in an evaporator. Chloroform was added to a remaining liquid. The liquid was washed with 1N dilute hydrochloric acid aqueous solution, 1N sodium hydroxide aqueous solution and then water. Thereafter, the washed matter was dried 8 hours at 70° C. under vacuum. The obtained product was light yellow, and identified as EHMB by $^1$H-NMR and elemental analysis. A yield ratio was 82.3% in this case.

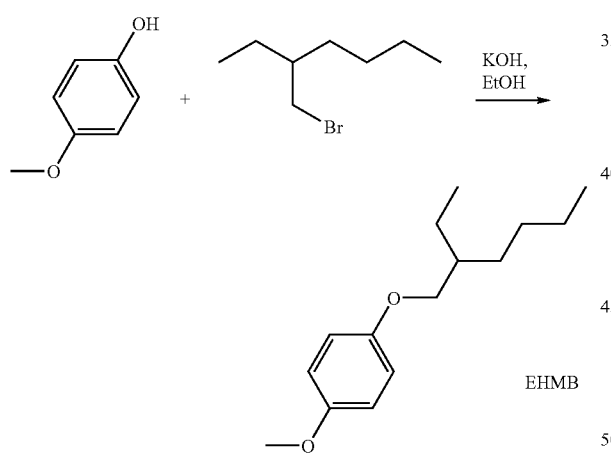

Thereafter, EHMB dissolved in 1,4-dioxane was dropped in a formaldehyde solution (37%) and hydrochloric acid (37%) kept at 0° C. After EHMB was completely dropped, the liquid was stirred 18 hours at a room temperature. A formaldehyde solution and hydrochloric acid were further added to the liquid at a period 10 hours after initiation of the reaction, and then the liquid was refluxed 5 hours in an oiling bath after 18 hours. When the reaction was finished, a reaction product was extracted in chloroform and washed with 1N-sodium hydroxide aqueous solution and then water, and the solvent was removed in an evaporator. After hot methanol was added to the processed liquid, the liquid was left as such at a room temperature and then put in a freezing chamber. A white coarse crystal was obtained. The coarse crystal was refined by dissolving it in methanol and then recrystallizing, washed with cold methanol, and then dried 8 hours at 40° C. under vacuum. A product was white solid, and identified as BCMB by $^1$H-NMR and elemental analysis. An yield ratio was 28.6%.

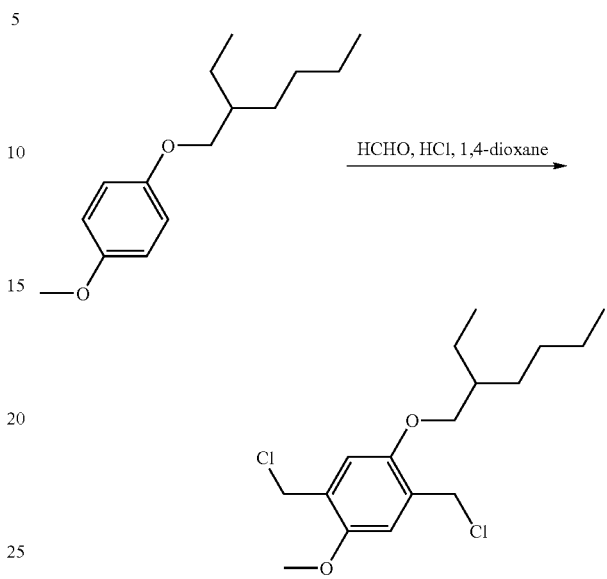

After BCMB and tert-butyl benzyl chloride (as an endcap agent) was dissolved in THF, potassium tert-butoxide was added to the liquid, and the liquid was stirred 30 hours at a room temperature in a nitrogen atmosphere. When the reaction was finished, THF was quantitatively decreased to about 1/10 in an evaporator, so as to precipitate red sediment by injection of methanol (a poor solvent). A red polymer was produced by drying a filtrate 8 hours at 40° C. under vacuum. The polymer was refined three times by reprecipitation purification using chloroform (a good solvent) and methanol (a poor solvent). The obtained polymer was identified as MEH-PPV by IR spectrum and elemental analysis. A yield ratio was 31/9%, weight average molecular Mw was 1,190,000, and a Mw/Mn ratio (Mn:number average molecular weight) was 2.7.

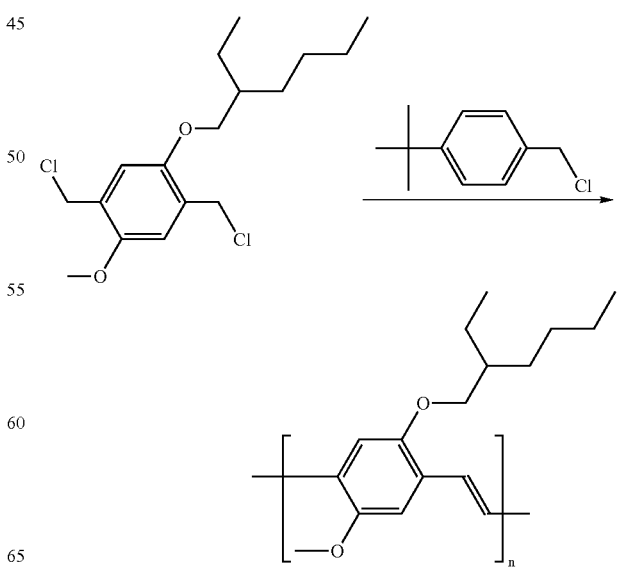

A liquid crystal was prepared by dispersing 10 mass % of 12-OKB in 4-cyano-4'-pentylbiphenyl (5CB) 12-OKB in a state incorporated in 5CB was transferred to a liquid crystalline phase at a temperature near a room temperature, and behaved as a nematic liquid crystal whose Schlieren texture was observed in concentration of 5 mass %, 10 mass % and 20 mass %.

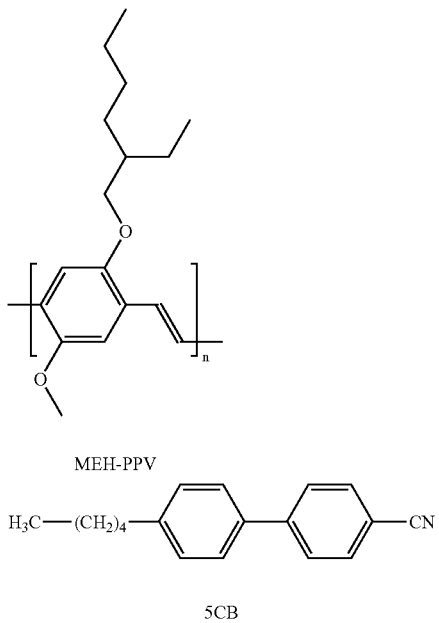

MEH-PPV

5CB

The bonded substrates (an empty cell) were dried 1 hour at a room temperature, received in Petri dish filled with the liquid crystal, and set in a desiccator. The empty cell was evacuated by a vacuum pump, and its liquid crystal injecting hole was dipped in the liquid crystal reserved in Petri dish, so that the liquid crystal slowly flowed from Petri dish into the empty cell.

Figure 3:
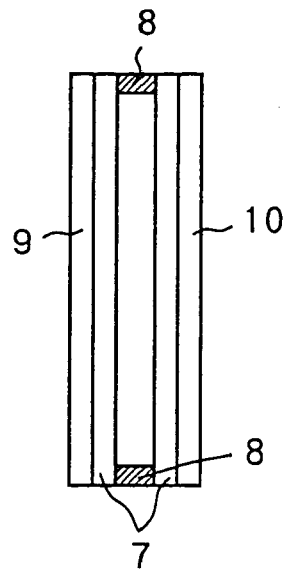
FIG. 3 is a view illustrating a cell having both surfaces to which polarizing plates are stacked.

After a sufficient amount of the liquid crystal was poured in the empty cell, the liquid crystal injecting hole was hermetically sealed with adhesives 8 (epoxy resin), as shown in FIG. 3. Thereafter, the cell was dried 1 hour.

Polarizing plates 9,10 were respectively laid on both surfaces of the cell 7, so that each polarizing plane was set parallel to the other. In this case, the surface of the cell was dark under power-off condition, but turned to light by application of 15V. Polarizing plates 9,10 were laid on both surfaces of the cell 7, so that each polarizing plane crosses to the other with a right angle on the contrary. In this case, the surface of the cell was light under power-off condition, but turned to dark by application of 15V. Turning to dark or light proved faculty as a liquid crystal display device. Light emission originated in MEH-PPV was observed, when the cell was charged with a voltage of 35V or higher. Luminance of 0.175 cd/m$^2$ at most was gained at 131V with an external quantum efficiency of 0.043%. Faculty of 12-OKB as a hole-transporting substance was recognized by such the light emission.

EXAMPLE 2

A cell 7 was fabricated in the same way as Example 1 except for using PEDOT doped with PSS (polystyrene sulfonate) instead of MEH-PPV at a side of the ITO substrate. PEDOT and PSS are respectively of:

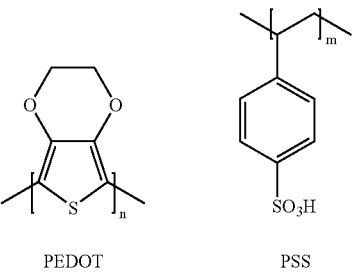

PEDOT          PSS

Polarizing plates 9,10 were respectively laid on both surfaces of the cell 7, so that each polarizing plane was set parallel to the other. In this case, the surface of the cell was dark under power-off condition, but turned to light by application of 5V. Polarizing plates 9,10 were laid on both surfaces of the cell 7, so that each polarizing plane crossed to the other with a right angle on the contrary. In this case, the surface of the cell was light under power-off condition, but turned to dark by application of 5V. Turning to dark or light proved faculty as a liquid crystal display device. Light emission originated in MEH-PPV was observed, when the cell was charged with a voltage of 15V or higher. Luminance of 1.04 cd/m$^2$ at most was gained at 90V with an external quantum efficiency of 0.045%.

EXAMPLE 3

An organic electroluminescent display device, which also act as a transmission liquid crystal display device, was fabricated by pouring a liquid crystal in an empty cell in the same way as Example 2 except for formation of s transparent backside electrode instead of an Al layer without formation of an Al layer.

Polarizing plates 9,10 were respectively laid on both surfaces of the cell 7, so that each polarizing plane was set parallel to the other. In this case, the surface of the cell was dark under power-off condition, but turned to light by application of 14V. Polarizing plates 9,10 were laid on both surfaces of the cell 7, so that each polarizing plane crosses to the other with a right angle on the contrary. In this case, the surface of the cell was light under power-off condition, but turned to dark by application of 14V. Turning to dark or light proved faculty as a liquid crystal display device. Light emission originated in MEH-PPV was observed, when the cell was charged with a voltage of 40V or higher. Luminance of 0.7 cd/m$^2$ at most was gained at 155V with an external quantum efficiency of 0.019%.

EXAMPLE 4

A cell was fabricated in the same way as Example 2 except for using 8-OCu instead of 12-OKB.

Polarizing plates 9,10 were respectively laid on both surfaces of the cell 7, so that each polarizing plane was set parallel to the other. In this case, the surface of the cell was dark under power-off condition, but turned to light by application of 13V. Polarizing plates 9,10 were laid on both surfaces of the cell 7, so that each polarizing plane crossed to the other with a right angle on the contrary. In this case, the surface of the cell was light under power-off condition, but turned to dark by application of 13V. Turning to dark or light proved faculty as a liquid crystal display device. Light emission originated in 8-OCu was observed, when the cell was charged with a voltage of 60V or higher. Luminance of 0.5 cd/m² at most was gained at 140V.

EXAMPLE 5

A cell was fabricated in the same way as Example 1 except for using PVK (polyvinylcarbazole) and cumarin-6 instead of 12-OKB. PVK and cumarin-6 are respectively of:

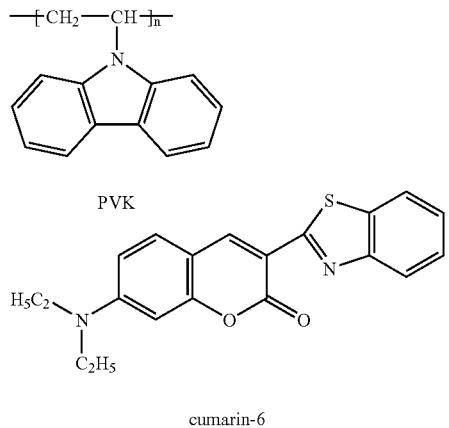

cumarin-6

Polarizing plates 9,10 were respectively laid on both surfaces of the cell 7, so that each polarizing plane was set parallel to the other. In this case, the surface of the cell was dark under power-off condition, but turned to light by application of 15V. Polarizing plates 9,10 were laid on both surfaces of the cell 7, so that each polarizing plane crossed to the other with a right angle on the contrary. In this case, the surface of the cell was light under power-off condition, but turned to dark by application of 15V. Turning to dark or light proved faculty as a liquid crystal display device. Light emission originated in cumarin-6 was observed, when the cell was charged with a voltage of 70V or higher. Luminance of 0.6 cd/m² at most was gained at 130V.

For comparison, a cell was fabricated without use of PVK. In this case, an initial voltage for light emission originated in cumarin-6 increased to 110V.

Decrease of the initial voltage means that PVK mixed in the liquid crystal act as a carrier-transporting substance, while cumarin-6 has faculty as a luminous substance.

EXAMPLE 6

A cell was fabricated in the same way as Example 1 except for using TPD (tetraphenyl diamine) instead of 12-OKB. TPD is of:

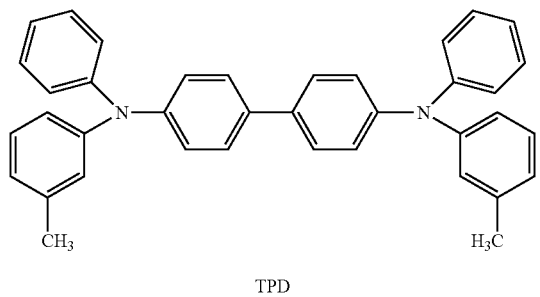

TPD

Polarizing plates 9,10 were respectively laid on both surfaces of the cell 7, so that each polarizing plane was set parallel to the other. In this case, the surface of the cell was dark under power-off condition, but turned to light by application of 13V. Polarizing plates 9,10 were laid on both surfaces of the cell 7, so that each polarizing plane crossed to the other with a right angle on the contrary. In this case, the surface of the cell was light under power-off condition, but turned to dark by application of 13V. Turning to dark or light proved faculty as a reflecting liquid crystal display device. Light emission originated in MEH-PPV was observed, when the cell was charged with a voltage of 50V or higher. Luminance of 1.2 cd/m² at most was gained at 120V. The result proved that the liquid crystal layer containing a low molecule carrier-transporting substance dispersed therein has faculty as a carrier-transporting layer.

EXAMPLE 7

Two glass substrates coated with ITO patterns were prepared by the same way as Example 1. PEDOT doped with PSS (polyethylene sulfonate) was deposited as a thin layer of 100 nm in thickness on one glass substrate and then rubbed, while MEH-PPV was deposited as an electroluminescent layer of 100 nm in thickness and then rubbed. These glass substrates were piled up with a cell gap of 1 μm in the manner such that the PEDOT layer faced to the MEH-PPV layer, and bonded together with epoxy resin except for a liquid crystal injecting hole. In this example, a liquid prepared by dispersing TPD-8 in 5CB at a ratio of 5 mass % was used as a carrier-transporting substance.

TPD-8 was gradually heated at a speed of 20° C./minute, held 5 minutes at a predetermined temperature and cooled at a speed of 30° C./minute on a hot stage for observation of its crystallinity. TPD-8 solely did not behave as a liquid crystal. However, when TPD-8 disposed in 5CB at a ratio of 5 mass % was subjected to the same examination, phase transition was detected at 35° C. on a cooling stage. The phase transition temperature lowered as increase of concentration of TPD8 in 5CB. The result proves that TPD-8 was transformed to a liquid crystal at a room temperature in the state incorporated in 5CB. TPD-8 dispersed in 5CB at a ratio of 5, 10 or 20 mass % was a nematic liquid crystal having a Schileren texture. The phase transition may be derived from collapse of structure of 5CB due to steric hindrance caused by triphenylamine structure of TPD-8 or by magnitude of a rotation angle of an octyloxy unit at a p-position.

Figure 4:
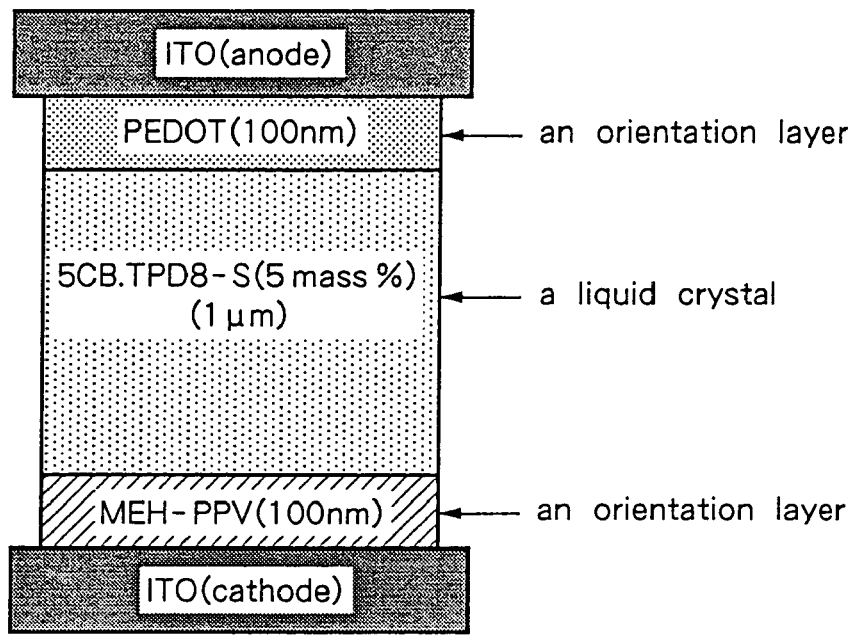
FIG. 4 shows a lamellar structure of an organic electroluminescent device fabricated in Example 7.

The bonded substrates (an empty cell) were dried 1 hour at a room temperature, received in Petri dish filled with the liquid crystal, and set in a desiccator. The empty cell was evacuated by a vacuum pump, and its liquid crystal injecting hole was dipped in the liquid crystal reserved in Petri dish, so that the liquid crystal slowly flowed from Petri dish into the empty cell. After a sufficient amount of the liquid crystal was poured in the empty cell, the liquid crystal injecting hole was hermetically sealed with adhesives 8 (epoxy resin), as shown in FIG. 4. Thereafter, the cell was dried 1 hour.

Polarizing plates 9,10 were respectively laid on both surfaces of the cell 7, so that each polarizing plane was set parallel to the other. In this case, the surface of the cell was dark under power-off condition, but turned to light by application of 18V. Polarizing plates 9,10 were laid on both surfaces of the cell 7, so that each polarizing plane crosses to the other with a right angle on the contrary. In this case, the surface of the cell was light under power-off condition, but turned to dark by application of 18V. Turning to dark or light proved faculty as a liquid crystal display device. Light emission originated in MEH-PPV was observed, when the cell was charged with a voltage of 28V or higher. Luminance of 2.5 cd/m² at most was gained at 47V. Faculty of 12-OKB as a hole-transporting substance was recognized by such the light emission.

EXAMPLE 8

PSS-doped PEDOT was used as an oriented film to liquid crystal instead of MEH-PPV. An electroluminescent liquid crystal was prepared by adding 10 mass % 12-OKB and 0.3 mol % Ir(ppy)$_3$ to 5CB instead of TPD-8 and heated at 50° C. An electroluminescent cell was fabricated in the same way as Example 7.

Polarizing plates 9,10 were respectively laid on both surfaces of the cell 7, so that each polarizing plane was set parallel to the other. In this case, the surface of the cell was dark under power-off condition, but turned to light by application of 10V. Polarizing plates 9,10 were laid on both surfaces of the cell 7, so that each polarizing plane crosses to the other with a right angle on the contrary. In this case, the surface of the cell was light under power-off condition, but turned to dark by application of 10V. Turning to dark or light proved faculty as a liquid crystal display device. Light emission originated in Ir(ppy)$_3$ was observed, when the cell was charged with a voltage of 57V or higher. Luminance of 17.8 cd/m² at most was gained at 92V. The results prove that 5CB dispersing 12-OKB therein behaved as a hole-transporting substance, while Ir(ppy)$_3$ behaved as a light-emitting substance.

Figure 5:
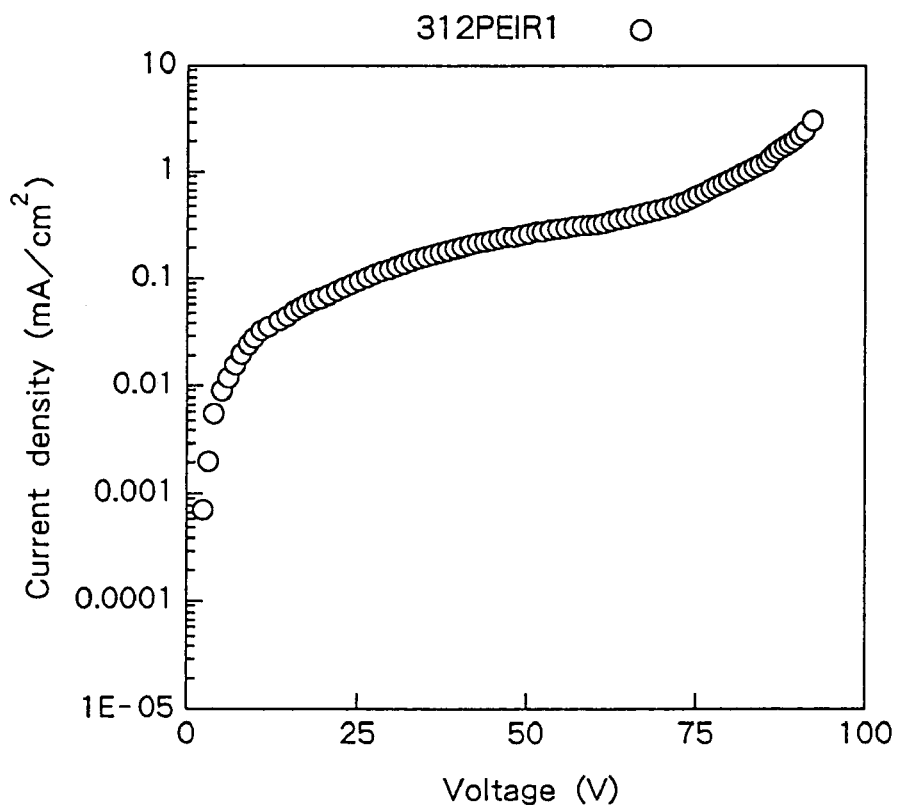
FIG. 5 is a graph illustrating voltage-current characteristic of an organic electroluminescent device fabricated in Example 8.

The produced organic electroluminescent device had voltage-current characteristic as shown in FIG. 5 and relationship of emission intensity with voltage as shown in FIG. 6.

The organic electroluminescent display device proposed by the present invention can be also driven as a liquid crystal display device, since a carrier-transporting layer and/or an organic luminous layer having faculty as a liquid crystal element is laminated on a transparent substrate. Due to the faculty as a liquid crystal element, the new display device is used as a liquid crystal display device at a day time or in a lighted place where an image is distinctly observed, and also as an electroluminescent display device in a dark place. Such switching of display mechanism saves power consumption. Furthermore, the new electroluminescent display device can be fabricated in a thin state without complication of process, since a liquid crystal substance is incorporated in the carrier-transporting layer and/or the organic luminous layer of the organic electroluminescent element itself.

The invention claimed is:

1. An organic electroluminescent display device comprising:
   a cell including at least one carrier-transporting layer comprising a liquid crystal substance and at least one organic luminous layer sandwiched between a transparent electrode and a backside electrode each held in parallel to the other, the other;
   a substrate having two surfaces, the cell being laid on one surface of the substrate; and
   a polarizing plate laid on the other surface of the substrate, wherein a layer adjacent the liquid crystal substance is an oriented layer; and
   wherein said display device is driven as a liquid crystal display device at a voltage lower than a light emission initiating potential of the organic luminous layer or as an electroluminescent display device at a voltage higher than the light emission initiating potential of the organic luminous layer in response to magnitude of an applied voltage.

2. The organic electroluminescent display device according to claim 1, wherein the organic luminous layer includes a polymer.

3. The organic electroluminescent device according to claim 1, wherein the organic luminous layer includes a polymer dispersing a low molecule therein.

4. The organic electroluminescent display device according to claim 1, wherein the carrier-transporting layer includes a nematic liquid crystal layer.

5. The organic electroluminescent display device according to claim 1, wherein the carrier-transporting layer comprises a liquid crystal layer having a low-molecular carrier-transporting substance dispersed therein.

6. The organic electroluminescent display device according to claim 5, wherein the liquid crystal layer contains two or more different organic compounds.

7. An organic electroluminescent display device comprising:
   a cell including at least one carrier-transporting layer and at least one organic luminous layer comprising a liquid crystal substance sandwiched between a transparent electrode and a backside electrode held in parallel to said transparent electrode;
   a substrate having two surfaces, the cell being laid on one surface of the substrate; and
   a polarizing plate laid on the other surface of the substrate, wherein a layer adjacent the liquid crystal substance is an oriented layer; and
   wherein said display device is driven as a liquid crystal display device at a voltage lower than a light emission initiating potential of the organic luminous layer and as an electroluminescent display device at a voltage higher than the light emission initiating potential of the organic luminous layer in response to magnitude of an applied voltage.

8. The organic electroluminescent display device according to claim 7, wherein the carrier-transporting layer comprises a polymer.

9. The organic electroluminescent display device according to claim 7, wherein the carrier-transporting layer comprises a polymer dispersing a low molecule therein.

10. The organic electroluminescent display device according to claim 7, wherein the organic luminous layer includes a nematic liquid crystal layer.

11. The organic electroluminescent display device according to claim 10, wherein the liquid crystal layer includes two or more different organic compounds.

12. An organic electroluminescent display device comprising:
   a cell including an organic luminous layer and a carrier-transporting layer, either one or both of which includes a liquid crystal, sandwiched between a transparent electrode and a backside electrode held in parallel to said transparent electrode;
   a substrate having two surfaces, the cell being laid on one surface of the substrate; and
   a polarizing plate laid on the other surface of the substrate, wherein a layer adjacent the liquid crystal is an oriented layer; and
   wherein said display device is driven as a liquid crystal display device at a voltage lower than a light emission initiating potential of the organic luminous layer and as an electroluminescent display at a voltage higher than the light emission initiating potential of the organic luminous layer device in response to magnitude of an applied voltage.

13. The organic electroluminescent display device according to claim 12, wherein the liquid crystal includes two or more of different organic compounds.

14. An organic electroluminescent display device including at least one organic luminous layer comprising an electroluminescent liquid crystal sandwiched between a transparent electrode and a backside electrode each held in parallel to the other,
   wherein a layer adjacent the electroluminescent liquid crystal is an oriented layer; and
   wherein said display device is driven as a liquid crystal display device and as an electroluminescent display device in response to magnitude of an applied voltage.

15. An organic electroluminescent display device including at least one carrier-transporting layer comprised of a liquid crystal substance and at least one organic luminous layer sandwiched between a transparent electrode and a backside electrode each held in parallel to the other,
   wherein said display device is driven as a liquid crystal display device or as an electroluminescent display device in response to magnitude of an applied voltage;
   wherein the carrier-transporting layer comprises a liquid crystal layer having a low-molecular carrier-transporting substance dispersed therein;
   wherein the liquid crystal layer contains two or more different organic compounds; and
   wherein at least one of the two or more different compounds is Ir(ppy)$_3$ having a formula of:

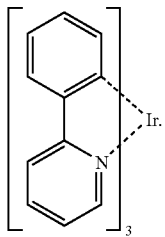

16. An organic electroluminescent display device including at least one carrier-transporting layer and at least one organic luminous layer comprising a liquid crystal substance sandwiched between a transparent electrode and a backside electrode held in parallel to said transparent electrode,
   wherein said display device is driven as a liquid crystal display device or as an electroluminescent display device in response to magnitude of an applied voltage;
   wherein the organic luminous layer includes a nematic liquid crystal layer;
   wherein the liquid crystal layer includes two or more different organic compounds; and
   wherein at least one of the two or more different organic compounds is Ir(ppy)$_3$ having a formula of:

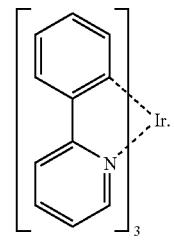

17. An organic electroluminescent display device including an organic luminous layer and a carrier-transporting layer, either one or both of which includes a liquid crystal, sandwiched between a transparent electrode and a backside electrode;
   wherein said display device is driven as a liquid crystal display device or as an electroluminescent display device in response to magnitude of an applied voltage;
   wherein the liquid crystal includes two or more different organic compounds; and
   wherein at least one of the two or more different organic compounds is Ir(ppy)$_3$ having a formula of:

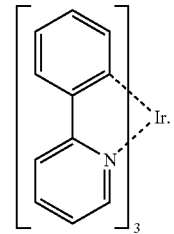

* * * * *

UNITED STATES PATENT AND TRADEMARK OFFICE
CERTIFICATE OF CORRECTION

PATENT NO. : 7,195,826 B2 Page 1 of 1
APPLICATION NO. : 10/650361
DATED : March 27, 2007
INVENTOR(S) : Kido et al.

It is certified that error appears in the above-identified patent and that said Letters Patent is hereby corrected as shown below:

Column 29, Line 55, Claim 1, "parallel to the other, the other;" should read -- parallel to the other; --

Signed and Sealed this

Seventh Day of August, 2007

JON W. DUDAS
*Director of the United States Patent and Trademark Office*